(12) United States Patent
Schwan

(10) Patent No.: US 10,050,396 B2
(45) Date of Patent: Aug. 14, 2018

(54) CONTACT DEVICE FOR HIGH-CURRENT TRANSFER

(71) Applicant: TE Connectivity Germany GmbH, Bensheim (DE)

(72) Inventor: Ralf Schwan, Einhausen (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 15/641,678

(22) Filed: Jul. 5, 2017

(65) Prior Publication Data
US 2018/0013249 A1 Jan. 11, 2018

(30) Foreign Application Priority Data
Jul. 5, 2016 (DE) .................. 10 2016 112 279

(51) Int. Cl.
| | | |
|---|---|---|
| H01R 9/26 | (2006.01) | |
| H01R 25/16 | (2006.01) | |
| H01R 13/00 | (2006.01) | |
| H02G 5/10 | (2006.01) | |
| H02B 11/04 | (2006.01) | |
| H05K 7/20 | (2006.01) | |
| H01H 1/62 | (2006.01) | |
| H02B 1/56 | (2006.01) | |

(52) U.S. Cl.
CPC ......... *H01R 25/162* (2013.01); *H01R 13/005* (2013.01); *H02B 11/04* (2013.01); *H02G 5/10* (2013.01); *H01H 1/62* (2013.01); *H02B 1/56* (2013.01); *H05K 7/20254* (2013.01); *H05K 7/20263* (2013.01); *H05K 7/20272* (2013.01)

(58) Field of Classification Search
CPC ...... H01R 9/26; H01R 9/2675; H01R 9/2408; H01R 27/00; H01R 103/00
USPC ..... 439/716, 218, 715, 717, 222; 307/43, 32
See application file for complete search history.

(56) References Cited

U.S. PATENT DOCUMENTS

| 7,275,960 B2* | 10/2007 | Fukushima | H01R 9/0524 439/607.15 |
| 8,425,237 B2* | 4/2013 | Sass | H01R 12/721 439/62 |
| 8,979,575 B2* | 3/2015 | Cheng | H05K 7/2039 439/487 |
| 2013/0323964 A1* | 12/2013 | Cheng | H05K 7/2039 439/487 |
| 2014/0199881 A1 | 7/2014 | Manahan et al. | |

FOREIGN PATENT DOCUMENTS

FR 2723466 A1 8/1994

OTHER PUBLICATIONS

German Office Action, dated Mar. 17, 2017, 12 pages.

* cited by examiner

*Primary Examiner* — Phuong Chi T Nguyen
(74) *Attorney, Agent, or Firm* — Barley Snyder

(57) ABSTRACT

A connector that includes a contact, a connection piece, and a cooling unit. The connection piece is received by the contact, and the cooling unit is connected to the connection piece. The cooling unit includes a heat sink spaced from the contact, a first heat exchanger section between the contact and the connection piece, a second heat exchanger section positioned in the heat sink and in communication with the first heat exchanger section, and a heat transfer medium that circulates between the first heat exchanger section and the second heat exchanger section.

23 Claims, 5 Drawing Sheets

CONTACT DEVICE FOR HIGH-CURRENT TRANSFER

CROSS-REFERENCE TO RELATED APPLICATION

This application claims the benefit of the filing date under 35 U.S.C. § 119(a)-(d) of German Patent Application No.102016112279.3 filed on Jul. 5, 2016.

FIELD OF THE INVENTION

The present invention relates to a connector and, more particularly, to a connector for the transfer of high current.

BACKGROUND

There is known a connector used to provide current to bus bars. This known connector generally includes a contact and a housing. The contact is electrically connected to the bus bar. However, the contact heats up considerably when transferring a high rate current to the bus bar. As a result, the heating limits the rate at which the current can be introduced into the bus bar using the contact.

Therefore, there is a need for an improved connector that is capable of providing a high rate current through a contact.

SUMMARY

A connector, constructed in accordance with the present invention, includes a contact, a connection piece, and a cooling unit. The connection piece is received by the contact and the cooling unit is connected to the connection piece. The cooling unit includes a heat sink spaced from the contact, a first heat exchanger section between the contact and the connection piece, a second heat exchanger section in the heat sink and in communication with the first heat exchanger section, and a heat transfer medium that circulates between the first heat exchanger section and the second heat exchanger section.

BRIEF DESCRIPTION OF THE DRAWINGS

The above and other features of the present invention will be described with reference to the accompanying drawings, in which.

DETAILED DESCRIPTION OF THE EMBODIMENT(S)

Figure 1:
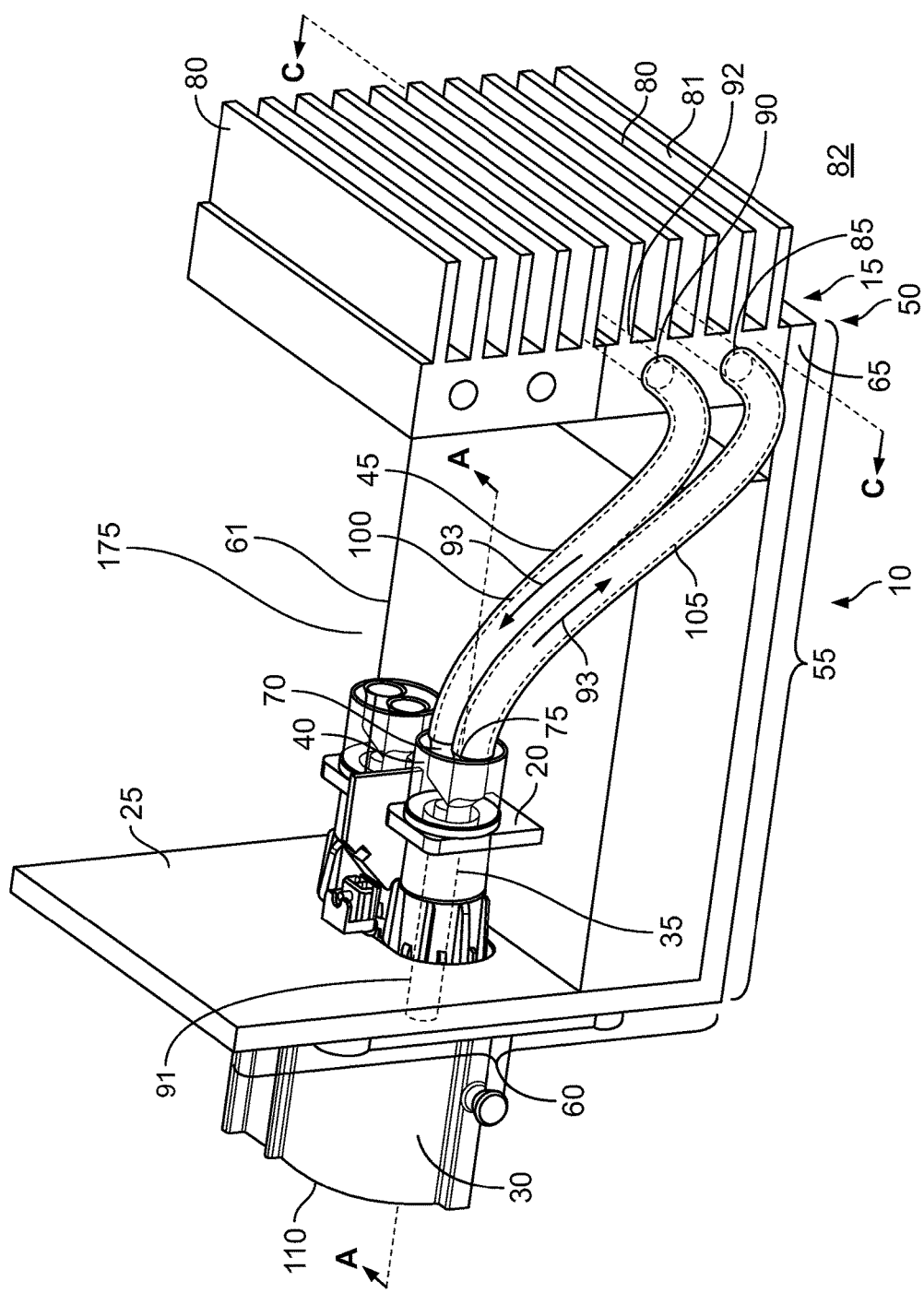
FIG. 1 is a perspective depiction of an electrical connector assembly having an electrical connector according to the invention.

The present invention will be described in further detail with reference to the following embodiments, taken in conjunction with the accompanying drawings. The following description of embodiments of the present invention with reference to the accompanying drawings is intended to explain the general inventive concept of the present invention and should not be construed as limiting the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

With reference to the Figures, an electrical connector assembly 10 according to the invention is shown. The electrical connector assembly 10 generally includes a connector 15, an electrical terminal 20, and an assembly housing 25.

The connector 15 includes a connector housing 30, a contact 35, a connection piece 40, and a cooling unit 45. The cooling unit 45 has a heat sink 50.

In the shown embodiment, the connector 15 is bipolar, for example, and the connector includes two contacts 35 that are arranged in a single connector housing 30. By way of example, for every contact 35 there is respectively a cooling unit 45. The connector 15 can also be configured differently and, for example, a different number of contacts 35 can be supplied and/or several contact s 35 can be assigned to the cooling unit 45.

In the shown embodiment, the assembly housing 25 includes a first housing section 55 and a second housing section 60. The first housing section 55 is connected to the second housing section 60 at one solid end. Preferably, the first housing section 55 is arranged at right angles to the second housing section 60. The heat sink 50 is arranged adjacent to a free end 65 of the first housing section 55. The connector housing 30 is attached to the second housing section 60 in a central position, for example.

The electrical terminal 20 is configured as a bus bar, for example. Alternatively to the electrical terminal 20, the electrical terminal 20 can also have a cable lug.

The electrical terminal 20 runs parallel to the second housing section 60. The electrical terminal 20 is arranged between the contact 35 and the heat sink 50. As shown, the assembly housing 25 is made from an electrically insulating material and/or a dielectric material. The assembly housing 25 can include, at least in sections, an electrically conductive material. As a result, the assembly housing 25 may provide a shielding function.

Furthermore, a control apparatus 61, which is electrically connected to the electrical terminal 20 and which is, for example, mechanically attached to the first housing section 55, may be provided between the first housing section 55 and the electrical terminal 20 (symbolically represented in FIG. 1).

The contact 35 is attached to the connector housing 30. The connector housing 30 has, like the assembly housing 25, an electrically insulating material. The contact 35 is further electrically coupled to the electrical terminal 20.

The connection piece 40 is arranged on the contact 35. The connection piece 40 has a first inlet 70 and a first outlet 75. The heat sink 50 has a cooling element 80 with a second inlet 85 and a second outlet 90, for example. The cooling element 80 is configured as a passive cooling element 80, such that no additional fan device is provided.

The cooling element 80 has a cooling fin 81 on a side that faces away from the electrical terminal 20 and which faces the surrounding environment 82. The cooling fin 81 is arranged running parallel to the electrical terminal 20, for example. The cooling fin 81 can also be orientated differently or the cooling fin 81 can be omitted.

The cooling unit 45 also has, for example, a first heat exchanger section 91, a second heat exchanger section 92, a heat transfer medium 93, a first connection tube 100, and a second connection tube 105.

The heat transfer medium 93 is, irrespective of its phase state, electrically insulated and/or a dielectric. Preferably, the heat transfer medium 93 includes the following materials: water, preferably deionized water, perfluorinated carbon, hydrocarbon chain, long-chain hydrocarbon, synthetic oil, transformer oil, polyalphaolefin, ester oil.

The heat transfer medium 93 flows in a circuit inside the cooling unit 45. Preferably, the cooling unit 45 is completely filled with the heat transfer medium 93. The first heat exchanger section 91 is arranged in the contact 35 between the first inlet 70 of the connection piece 40 and the first outlet 75 of the connection piece 40 in the direction of flow of the heat transfer medium 93. The second heat exchanger section 92 is arranged between the second inlet 85 of the cooling element 80 and the second outlet 90 of the cooling element 80 in the direction of flow. The first connection tube 100 connects the first inlet 70 of the connection piece 40 to the second outlet 90 of the cooling element 80 in a fluidic manner. The first connection tube 100 is, in this case, arranged downstream of the first outlet 75 of the connection piece 40. The second connection tube 105 connects the first outlet 75 of the connection piece 40 to the second inlet 85 of the cooling element 80 in a fluidic manner. The second connection tube 105 is, in this case, arranged downstream of the first outlet 75 of the connection piece 40.

Figure 2:
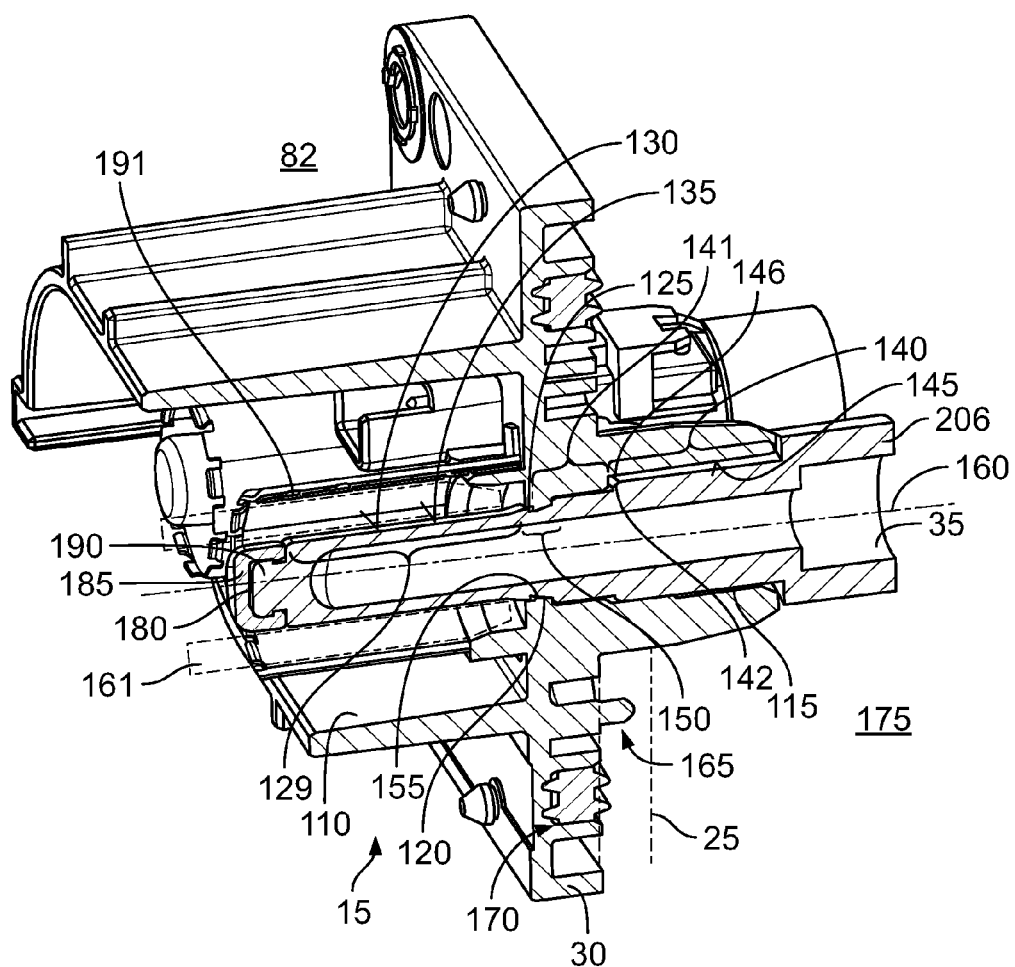
FIG. 2 is a sectional view of the connector in FIG. 1 taken along line A-A.

As shown in FIG. 2, the connector housing 30 has a first receptacle 110 and a second receptacle 115. The first receptacle 110 is on a side of the connector housing 30 which faces away from the electrical terminal 20. The second receptacle 115 is arranged on a side of the connector housing 30 which faces the electrical terminal 20. The first receptacle 110 is connected to the second receptacle 115 by means of a passage opening 120. Furthermore, a catch 125 can be provided on the passage opening 120.

The contact 35 includes a contact section 129, an attachment section 140, and an anti-rotation device 141. The contact section 129 has a contact surface 135 on an outer peripheral surface 130. The contact surface 135 has a cylindrical configuration. The contact section 129 can also be configured as a socket contact.

The anti-rotation device 141 is arranged between the attachment section 140 and the contact surface 135 and prevents the contact 35 from rotating in the receptacle 110, 115. It is particularly advantageous here if an offset 142 is provided between the attachment section 140 and the anti-rotation device 141 or on the attachment section 140.

The second receptacle 115 has a receiving contour 145 which is configured corresponding to the attachment section 140. The receiving contour 145 and the attachment section 140 of the contact 35 have a cylindrical configuration, for example. In the shown embodiment, the receiving contour 145 has a further offset 146, for example, which is assigned to the offset 142 of the contact 35.

When the contact 35 is mounted, the attachment section 140 is in the second receptacle 115. The offset 142 abuts against the further offset 146 of the receiving contour 145 and secures an axial position of the contact 35 along a longitudinal axis 160. Furthermore, further insertion of the contact 35 into the second receptacle 115 is prevented by the offset 142 abutting against the further offset 146.

The contact surface 135 projects into the first receptacle 110. The contact surface 135 brings the contact 35 into electrical contact with a secondary connector 161 (illustrated schematically with dashed lines) which is configured as a socket contact, for example.

The catch 125 secures the contact 35 at the connector housing 30 in the longitudinal direction. For this purpose, in the shown embodiment, the contact 35 has a lug receiving space 150 between the contact surface 135 and the anti-rotation device 141, for example. Furthermore, a catching lug 155 is provided on the passage opening 120, which corresponds with the lug receiving space 150 and prevents the withdrawal of the contact 35 out of the second receptacle 115.

In order to ensure that the secondary connector 161 encompasses the contact section 129, in the shown embodiment the first receptacle 110, for example, is configured wider than the second receptacle 115 in the direction transverse to the longitudinal axis 160 of the contact 35. The design of the receptacle 110, 115 can also be different depending on the structural design of the contact 35.

Furthermore, the contact 35 may include an insulating cap 185 on a first longitudinal end 180, which is connected to the contact 35 by means of a catching receiving section 190, for example. The insulating cap 185 can also be omitted.

Furthermore, the connector 15 can have a shielding element 191, which is arranged in the first receptacle 110 and which is connected to the connector housing 30. The shielding element 191 encompasses the contact section 129 of the contact 35. The shielding element 191 is at a distance from the contact 35.

The connector housing 30 includes a retainer 165 on a side that faces the assembly housing 25. The retainer 165 fastens the connector housing 30 to the second housing section 60. Furthermore, a sealing mechanism 170 can be provided on the connector housing 30, in order to avoid an entry of liquids in a space 175 which is delimited by the assembly housing 25 and the heat sink 50.

Figure 3:
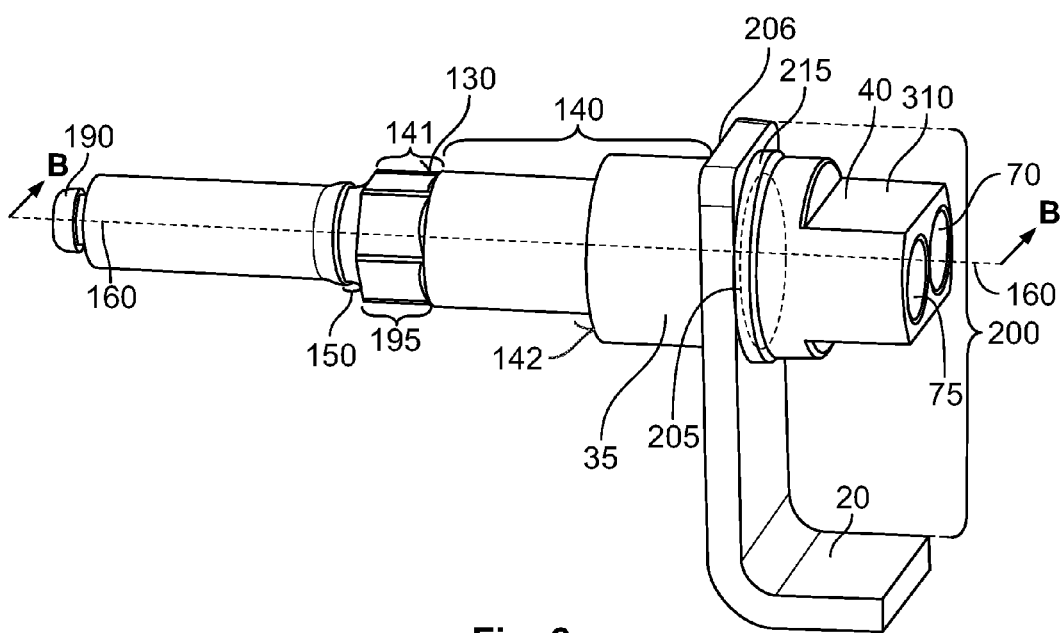
FIG. 3 is a perspective view of a connector according to the invention.

With reference to FIG. 3, the anti-rotation device 141 can have a polygonal design on the outer peripheral surface 130 in a sub region 195. The second receptacle 115 is configured corresponding, in sections, to the sub region 195. This has the advantage that a rotation of the contact 35 in the second receptacle 115 is reliably avoided.

The electrical terminal 20 includes a bus bar joining section 200. The bus bar joining section 200 is orientated perpendicular to the longitudinal axis 160 of the contact 35, for example. The bus bar joining section 200 has a secondary passage opening 205. The contact 35 abuts against the bus bar joining section 200 with an end face 210 that is arranged on a second longitudinal end 206 opposite the first longitudinal end 180.

A ring element 215, for example, is provided on a side of the bus bar joining section 200 that is opposite the contact 35. The ring element 215 can be configured as a washer.

The connection piece 40 extends through the secondary passage opening 205 and attaches the contact 35 and the ring element 215 onto respectively opposite sides of the bus bar joining section 200.

Figure 4:
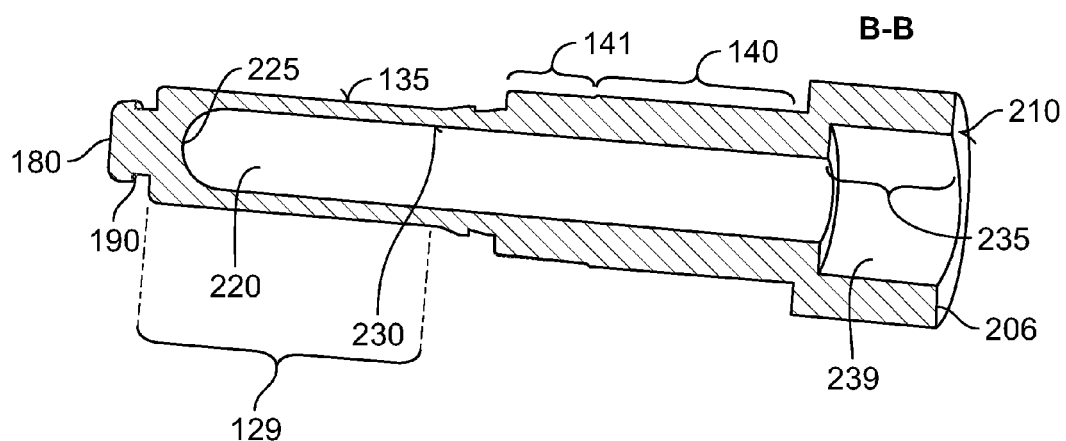
FIG. 4 is a sectional view of a contact of the connector of FIG. 3 taken along line B-B of FIG. 3.

With reference to FIG. 4, the contact 35 include a tube receiving passageway 220 which extends in the longitudinal direction parallel to the longitudinal axis 160 of the contact 35. The tube receiving passageway 220 includes a base 225 and a side surface 230 along the periphery. The tube receiving passageway 220 is configured as a bore, for example, and is open towards the second longitudinal end 206 of the contact 35. The contact 35 includes a first joining section 235 axially between the second longitudinal end 206 and the tube receiving passageway 220. The tube receiving passageway 220 opens at the joining section 235. Furthermore, the tube receiving passageway 220 is radially inside the contact surface 135.

The first joining section 235 includes an internal thread 239 along the inner peripheral surface. Relative to the longitudinal axis 160, the first joining section 235 is radially wider than the tube receiving passageway 220.

Figure 5:
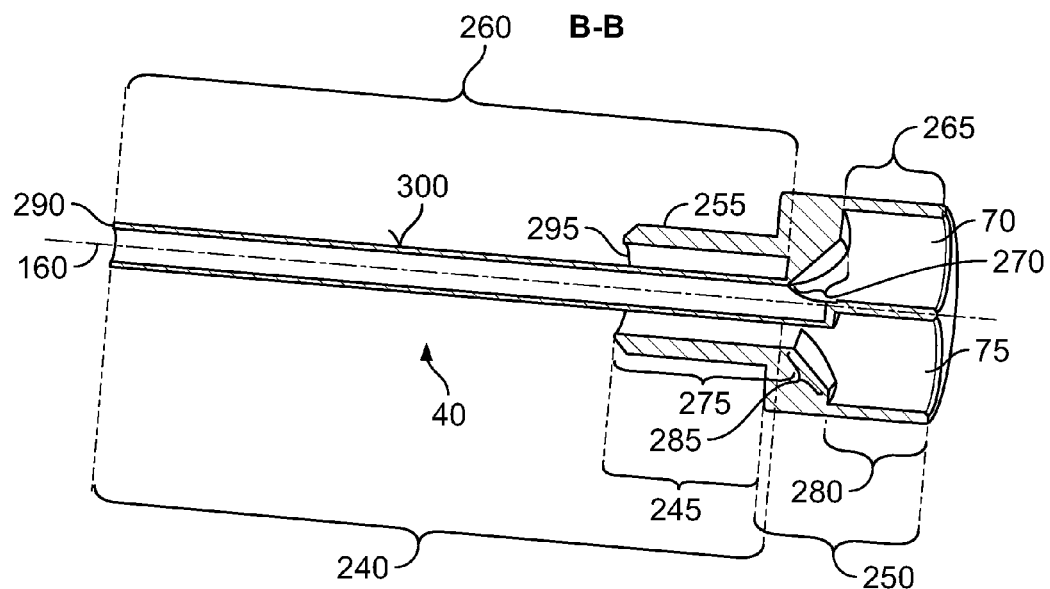
FIG. 5 is a sectional view of a connection piece of the connector of FIG. 3 taken along line B-B of FIG. 3.

With reference to FIG. 5, the connection piece 40 includes a tubular section 240, a second joining section 245, as well as a third joining section 250. The tubular section 240 is connected to the third joining section 250. The second joining section 245 is arranged radially and outwardly adjacent to the third joining section 250 on a side that faces the tubular section 240.

The second joining section 245 includes an external thread 255 on an outer peripheral surface. The external thread 255 corresponds to the internal thread 239. When the connection piece 40 is mounted on the contact 35, the second joining section 245 is screwed into the internal thread 239 using the external thread 255 and reliably secures the end face 210 against the bus bar joining section 200.

The tubular section 240 is arranged in the tube receiving passageway 220. The tubular section 240 runs in a straight line. In an alternative embodiment, the tubular section 240 may be curved. The tubular section 240 delimits on the inside a first channel section 260 of the connection piece 40.

Furthermore, the connection piece 40 includes a second channel section 265, a third channel section 270, a fourth channel section 275, a fifth channel section 280, and a sixth channel section 285. The number of channel sections 260, 265, 270, 275, 280, and 285, in the shown embodiment, is merely exemplary. Naturally, a different number of channel sections 260, 265, 270, 275, 280, and 285 may be provided.

The second channel section 265 is adjacent to the first inlet 70 of the connection piece 40. The second channel section 280 can have a cylindrical configuration. While the first channel section 260 is arranged centrally relative to the longitudinal axis 160, the second channel section 265 is offset from the longitudinal axis 160 and from the first channel section 260. The first channel section 260 and the second channel section 265 have a parallel orientation and are arranged offset in the axial direction. An attachment means can be provided on the second channel section 265 in order to connect the first connection tube 100 to the second channel section 265 in a fluid-tight manner.

The third channel section 270 is arranged between the first channel section 260 and the second channel section 265. The third channel section 270 is obliquely positioned relative to the longitudinal axis 160, extending into the first channel section 260 and the second channel section 265. The third channel section 270 connects the second channel section 265 and thus the first inlet 70 of the connection piece 40 to the first channel section 260 in a fluidic manner. The third channel section 270 can also be omitted, for example, or the third channel section 270 can be arranged perpendicularly to the first channel section 260 and/or to the second channel section 265.

The fourth channel section 275 has a ring-shaped configuration. The fourth channel section 275 is arranged radially on the outside of the tubular section 240. The fourth channel section 275 opens at an opening 295 in the tube receiving passageway 220. The fourth channel section 275 and the first channel section 260 are arranged axially overlapping in the longitudinal direction. An axial overlapping is understood to mean that two components, in the shown embodiment the first channel section 260 and the fourth channel section 275, for example, are projected in a projection plane in which the longitudinal axis 160 is arranged, wherein the components in the projection plane cover one another.

The fifth channel section 280 is arranged adjacent to the first outlet 75 of the connection piece 40. The fifth channel section 280 is offset relative to the longitudinal axis 160. The fifth channel section 280 can have a cylindrical configuration. Furthermore, the fifth channel section 280 is arranged axially overlapping the second channel section 265 and laterally offset from the second channel section 265. The fifth channel section 280 runs parallel to the second channel section 265.

Furthermore, a further attachment means can be provided on the fifth channel section 280 in order to connect the second connection tube 105 to the fifth channel section 280 in a fluid-tight manner.

The sixth channel section 285 is between the fifth channel section 280 and the fourth channel section 275. The sixth channel section 285 connects the fifth channel section 280 to the fourth channel section 275 in a fluidic manner. The sixth channel section 285 runs obliquely to the fifth channel section 280.

Figure 6:
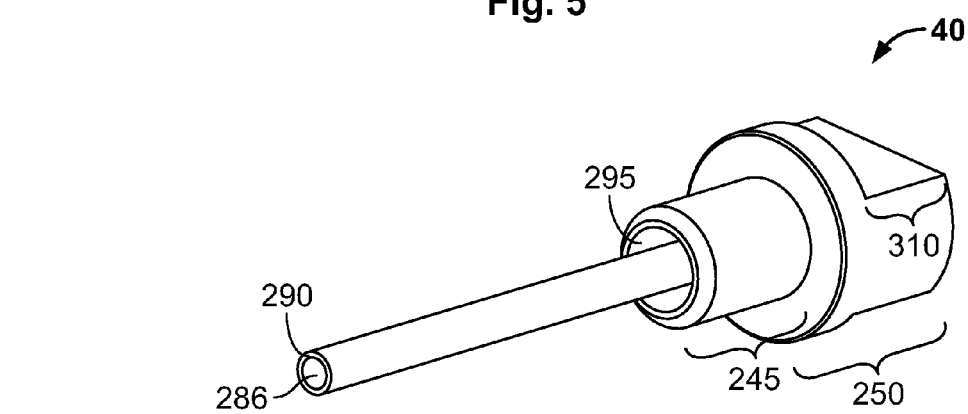
FIG. 6 is a front perspective view of the connection piece shown in FIG. 5.
Figure 7:
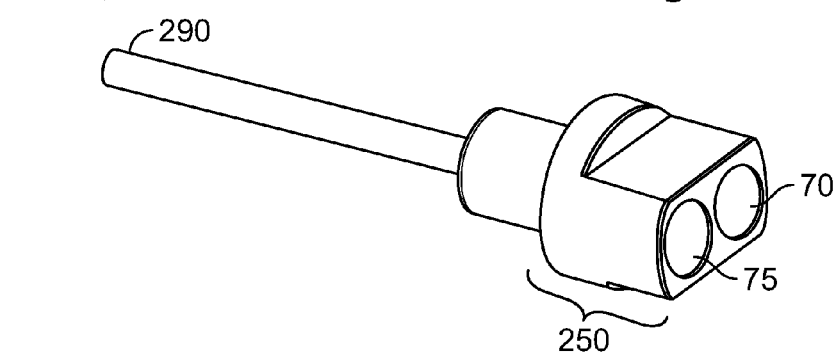
FIG. 7 is a rear perspective view of the connection piece shown in FIG. 5.

With reference to FIGS. 6 and 7, the connection piece 40 may also include a profile section 310 on the third joining section 250. A tool can used to move the connection piece 40 by means of the profile section 310, in order to screw the second joining section 245 into the first joining section 235 and to supply a clamping force in order to press the contact 35, at the end face on the second longitudinal end 206, against the bus bar joining section 200. Torque provided during the screwing-in is supported at the rear on the connector housing 30 using the anti-rotation device 141.

Figure 8:
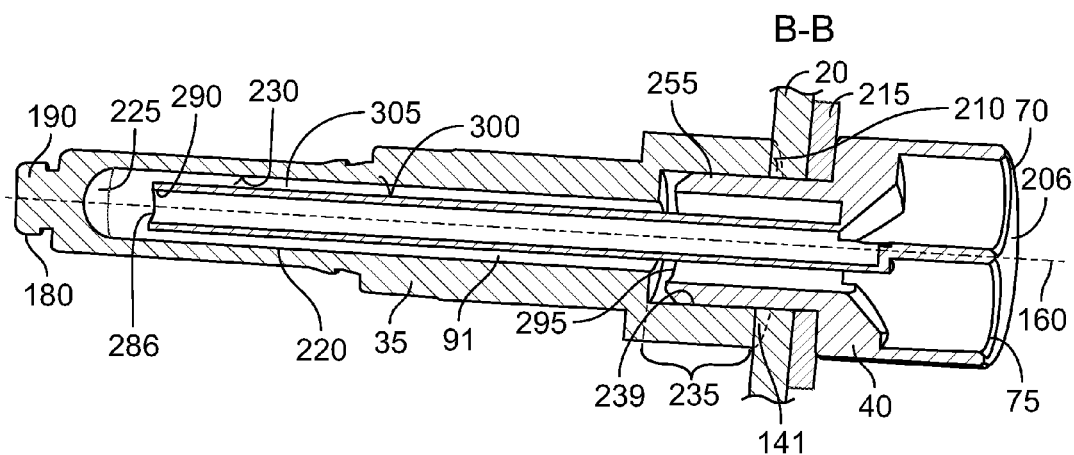
FIG. 8 is a sectional view of the connector of FIG. 3 taken along line B-B of FIG. 3, showing assembly of the connector with the connection piece.

With reference to FIG. 8, a further opening 286 of the first channel section 260 opens at a tip 290 of the tubular section 240 opposite the base 225 in the tube receiving passageway 220. The opening 295 is offset from the opening 286 of the first channel section 260 in the axial direction relative to the longitudinal axis 160.

The tubular section 240 includes an outer peripheral surface 300. The outer peripheral surface 300 is at a distance from the side surface 230. The side surface 230 together with the base 225 and the outer peripheral surface 300 of the tubular section 240 between the further opening 286 and opening 295 delimit a first heat exchanger section 91. The first heat exchanger section 91 is connected to the first outlet 75 of the connection piece 40 via the fourth to sixth channel sections 275, 280, and 285 in a fluidic manner.

Furthermore, the first heat exchanger section 91 is connected to the first inlet 70 of the connection piece 40 in a fluidic manner on the inlet side via the first to third channel sections 260, 265, and 270.

Figure 9:
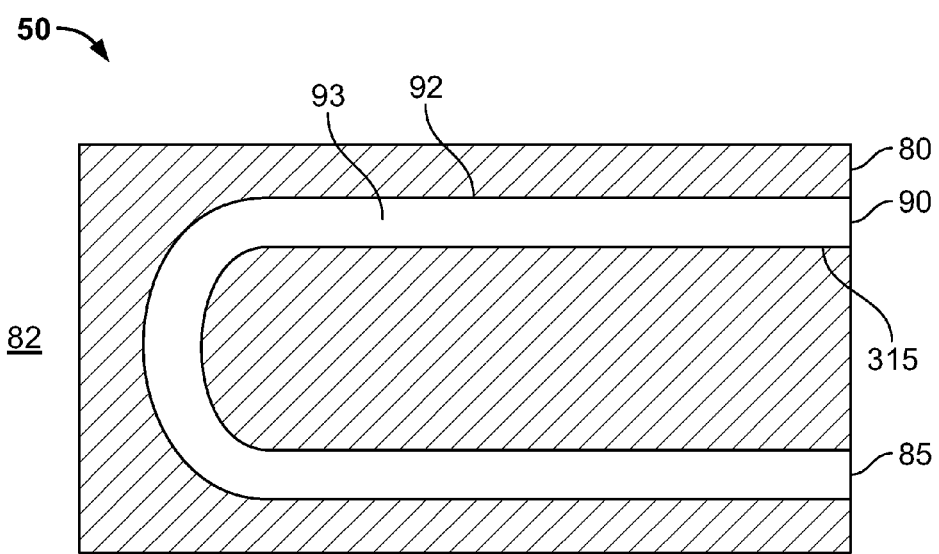
FIG. 9 is a sectional view of a cooling unit of the electrical connector assembly of FIG. 1 taken along line C-C of FIG. 1.

With reference to FIG. 9, the second heat exchanger section 92 is in the cooling element 80. The second heat exchanger section 92 is guided within the cooling element 80 in a channel shape, for example a U-shape, in the shown embodiment. Other designs of the second heat exchanger section 92 are also conceivable. The second heat exchanger section 92 is connected to the second inlet 85 on the inlet side and to the second outlet 90 of the cooling element 80 on the outlet side in a fluidic manner.

When the electrical connector assembly 10 is in operation, a secondary connector 161 is joined to the connector 15. The electrical connector assembly 10 transfers electrical energy with a high current between the secondary connector 161 and the electrical terminal 20. In the process, the contact 35 heats up, in particular in the region of the electrical contact between the secondary connector 161 at the contact surface 135. The heat introduced into the contact 35 is thus carried off from the contact 35 in that cold heat transfer medium 93 is introduced into the second channel section 265 via the first inlet 70 of the connection piece 40. The second channel section 265 guides the cold heat transfer medium 93 to the tip 290 of the tubular section 240 via the third channel section 270 and the first channel section 260. The heat transfer medium 93 enters the first heat exchanger section 91 at the tip 290. In the first heat exchanger section 91, the heat transfer medium 93 is guided within the tube receiving passageway 220 between the outer peripheral surface 300 of the tubular section 240, towards the further opening 295 of the fourth channel section 275. When flowing along the base 225 and the side surface 230, the heat transfer medium 93 absorbs heat from the contact 35 and heats up. The heated heat transfer medium 93 is carried off from the first heat exchanger section 91 via the further opening 295 and then enters the fourth channel section 275. The ring-shaped design of the fourth channel section 275 has the advantage that local overheating of the contact 35 is avoided by a uniform flow of the heat transfer medium 93 within the tube receiving passageway 220.

The heated heat transfer medium 93 is guided from the fourth channel section 275 to the fifth channel section 280 via the sixth channel section 285. The heated heat transfer medium 93 enters the second connection tube 105 at the fifth channel section 280 via the first outlet 75 of the connection piece 40. The second connection tube 105 guides the heated heat transfer medium 93 to the second inlet 85 of the cooling element 80. The heated heat transfer medium 93 enters the cooling element 80 at the second inlet 85 of the cooling element 80. In the second heat exchanger section 92, the heated heat transfer medium 93 gives off heat to the cooling element 80. The cooling element 80 gives the heat off to an environment 82 surrounding the electrical connector assembly 10 via cooling fins 81. The cooled cold heat transfer medium 93 exits from the second heat exchanger section 92 at the second outlet 90 of the cooling element 80 and is guided to the first inlet 70 of the connection piece 40 via the first connection tube 100. The heat transfer medium 93 thus flows in a circuit.

Additionally, a distribution device (not illustrated in the figures) can be provided in order to force the flowing of the heat transfer medium 93 in the circuit between the first heat exchanger section 91 and the second heat exchanger section 92 for carrying heat off from the contact 35. This design has the advantage that a particularly high heat input can be carried off from the contact 35. The hoisting device can be arranged upstream or downstream of the first heat exchanger section 91.

Additionally or alternatively, it is also possible that the heat sink is arranged higher than the first heat exchanger section 91, such that the heat transfer medium flows in a circuit between the first heat exchanger section 91 and the second heat exchanger section 92 due to differences in density between the heated heat transfer medium 93 and the cold heat transfer medium.

It is of particular advantage here if the second outlet 90 is arranged below the second inlet 85.

Using dielectric materials for the connection tube 100, 105 as well as for the heat transfer medium 93 ensures that the heat sink 50 is not energized.

If a cooling unit 45 is provided for every contact 35, it is an advantage that the cooling elements 80 are arranged in a stack-like manner. The cooling units 45 can be configured identically.

Cooled heat transfer medium 93 can be directly guided to the warmest region within the contact surface 135 of the contact 35 by means of the above-described design of the electrical connector assembly 10, such that an overheating of the contact 35 is reliably avoided even when high currents are to be transferred. In particular, a particularly high carry-off of heat from the contact 35 can be ensured if the contact 35 has copper as the material. Furthermore, the design of the cooling element 80 described above ensures that no additional electrical insulation has to be supplied to the heat sink 50 and the contact 35.

The electrical connector assembly 10 is thus particularly suitable for plug-in hybrid vehicles and/or for electrical motor vehicles.

Although the invention has been illustrated and described in detail by the preferred exemplary embodiment, the invention is not restricted by the disclosed examples and other variations can be derived therefrom by the person skilled in the art without departing from the scope of the invention. In particular, it is conceivable for individual features to be omitted and/or for the features to be arranged differently.

What is claimed is:

1. A connector comprising,
a contact;
a connection piece received by the contact; and
a cooling unit connected to the connection piece and having:
(a) a heat sink spaced from the contact,
(b) a first heat exchanger section between the contact and the connection piece, and
(c) a second heat exchanger section in and connected to the heat sink and in communication with the first heat exchanger section, and
(d) a heat transfer medium circulating between the first heat exchanger section and the second heat exchanger section.

2. The connector according to claim 1, wherein the heat transfer medium has dielectric properties.

3. The connector according to claim 2, wherein the heat transfer medium includes water and an additive selected from a group consisting of a perfluorinated carbon, a hydrocarbon chain, a long-chain hydrocarbon, a synthetic oil, a transformer oil, a polyalphaolefin, and an ester oil.

4. The connector according to claim 1, wherein the contact includes a contact surface on an outer peripheral surface thereof.

5. The connector according to claim 4, wherein the contact further has a tube receiving passageway extending there through and receiving the connection piece.

6. The connector according to claim 5, wherein the contact further has a first joining section on a longitudinal end thereof.

7. The connector according to claim 6, wherein the connection piece includes a tubular section received by the tube receiving passageway.

8. The connector according to claim 7, wherein the connection piece further has a second joining section extending from the tubular section connecting to the first joining section.

9. The connector according to claim 8, wherein the first joining section has an internal thread and the second joining section has an external thread corresponding to the internal thread.

10. The connector according to claim 9, wherein the connection piece has an inlet at one end thereof.

11. The connector according to claim 10, wherein the connection piece further has a tip at an opposite end thereof.

12. The connector according to claim 11, wherein the connection piece further has a first channel section extending through an inside of the tubular section and in communication with the tip and the inlet.

13. The connector according to claim 12, wherein the tube receiving passageway has a base offset from the tip.

14. The connector according to claim 13, wherein the connection piece further has a second channel section adjacent to the inlet and offset from and running parallel to the first channel section.

15. The connector according to claim 14, wherein the connection piece further has a third channel section connecting the first channel section to the second channel section.

16. The connector according to claim 15, wherein the third channel section is inclined relative to the first channel section and the second channel section.

17. The connector according to claim 16, wherein the connection piece further has an outlet adjacent to the inlet.

18. The connector according to claim 17, wherein the tubular section has an outer peripheral surface spaced from the tube receiving passageway and delimiting the first heat exchanger section.

19. The connector according to claim 18, wherein the first heat exchanger section is connected to the outlet.

20. The connector according to claim 19, wherein the connection piece further has a fourth channel section overlapping the first channel section and an opening into the tube receiving passageway.

21. The connector according to claim 20, wherein the fourth channel section is ring-shaped and on a periphery of the tubular section.

22. The connector according to claim 21, wherein the connection piece further has a fifth channel section connecting the outlet with the fourth channel section.

23. The connector according to claim 22, wherein the cooling unit further includes:
  (a) a first connection tube connecting the heat sink to the inlet, and
  (b) a second connection tube connecting the outlet to the heat sink.

* * * * *